(12) United States Patent
Garg et al.

(10) Patent No.: US 11,420,346 B2
(45) Date of Patent: Aug. 23, 2022

(54) COATING FOR CUTTING IMPLEMENT

(71) Applicant: ACME UNITED CORPORATION, Fairfield, CT (US)

(72) Inventors: Dheeraj Garg, Shenzhen (CN); Richard S. Constantine, Monroe, CT (US)

(73) Assignee: ACME UNITED CORPORATION, Fairfield, CT (US)

( * ) Notice: Subject to any disclaimer, the term of this patent is extended or adjusted under 35 U.S.C. 154(b) by 0 days.

(21) Appl. No.: 16/997,523

(22) Filed: Aug. 19, 2020

(65) Prior Publication Data

US 2022/0055235 A1 Feb. 24, 2022

(51) Int. Cl.
| | |
|---|---|
| *B26B 13/00* | (2006.01) |
| *C01G 37/00* | (2006.01) |
| *C23C 14/06* | (2006.01) |
| *B26B 9/00* | (2006.01) |
| *B25B 27/20* | (2006.01) |
| *C23C 14/08* | (2006.01) |
| *A22C 25/00* | (2006.01) |

(Continued)

(52) U.S. Cl.
CPC ............ B26B 13/00 (2013.01); C01G 37/006 (2013.01); C23C 14/0676 (2013.01); *A01K 97/00* (2013.01); *A22C 25/006* (2013.01); *B25B 7/22* (2013.01); *B25B 27/205* (2013.01); *B26B 9/00* (2013.01); *C23C 14/0641* (2013.01); *C23C 14/08* (2013.01)

(58) Field of Classification Search
CPC ............... B26B 13/00; C23C 14/067
USPC ........................................... 428/697
See application file for complete search history.

(56) References Cited

U.S. PATENT DOCUMENTS

| 2011/0117344 A1* | 5/2011 | Chen ............... C23C 14/022 428/213 |
| 2012/0222315 A1* | 9/2012 | Buchtmann ........ C23C 14/0641 30/244 |

(Continued)

FOREIGN PATENT DOCUMENTS

CN 105803394 * 7/2016

OTHER PUBLICATIONS

Schieck et al. "Modern tool design for component grading incorporating simulation models, efficient tool cooling concepts and tool coating systems" CIRP Journal of Manufacturing Science and Technology 4 p. 189-199. (Year: 2011).*

*Primary Examiner* — Archene A Turner
(74) *Attorney, Agent, or Firm* — Bond Schoeneck & King, PLLC; George McGuire

(57) ABSTRACT

A cutting implement including a metal substrate and a coating is provided. The coating has zirconium PVD (ZrCRTiNO), which provides protection against corrosion of the metal substrate. In some instances, the zirconium PVD provides protection from corrosion for at least 200 hours. A layer of titanium nitride (TiN) can be added to the coating to increase the hardness of the metal substrate. In such an embodiment, the layer of titanium nitride (TiN) is applied before the zirconium PVD (ZrCRTiNO). Titanium nitride (TiN) coated steel is 3 to 5 times harder than uncoated steel. Thus, a combination of titanium nitride (TiN) and zirconium PVD (ZrCRTiNO) as a coating on a metal substrate can increase the life of the metal substrate by providing increased hardness and anti-corrosive properties.

19 Claims, 19 Drawing Sheets

(51) Int. Cl.
*A01K 97/00* (2006.01)
*B25B 7/22* (2006.01)

(56) References Cited

U.S. PATENT DOCUMENTS

2013/0287507 A1* 10/2013 Lind ................... C23C 14/0641
407/119
2018/0245202 A1* 8/2018 Gorokhovsky ......... C22C 38/50

* cited by examiner

COATING FOR CUTTING IMPLEMENT

BACKGROUND OF THE INVENTION

1. Field of the Invention

The present invention relates to stationary cutting implements and, more particularly, to a coating for stationary cutting implements.

2. Description of Related Art

Substantial effort has been expanded in improving the construction and operation of cutting implements for fishing, hunting, camping, and other outdoor uses. Ever increasing demands have been placed on manufacturers of these products to increase the ease of use, the wear resistance, corrosion resistance, and the ease in which the products can be cleaned, while maintaining a competitive price. For example, typical outdoor shears/knives have been unable to achieve a long-lasting cutting edge, which withstands the wide variety of products being cut and resists rust, at a competitive price.

Therefore, there is a need for continued improvements in cutting implements for outdoor use.

Description of the Related Art Section Disclaimer: To the extent that specific patents/publications/products are discussed above in this Description of the Related Art Section or elsewhere in this disclosure, these discussions should not be taken as an admission that the discussed patents/publications/products are prior art for patent law purposes. For example, some or all of the discussed patents/publications/products may not be sufficiently early in time, may not reflect subject matter developed early enough in time and/or may not be sufficiently enabling so as to amount to prior art for patent law purposes. To the extent that specific patents/publications/products are discussed above in this Description of the Related Art Section and/or throughout the application, the descriptions/disclosures of which are all hereby incorporated by reference into this document in their respective entirety(ies).

BRIEF SUMMARY OF THE INVENTION

It is an object of the present invention to provide a cutting implement having a metal substrate and a coating.

It is a further object of the present invention to provide a cutting implement having a coating that provides one or more of improved wear resistance, improved corrosion resistance, increased hardness, pleasing appearance, reduced user effort, and increased stain resistance.

These and other objects of the present invention are provided by a cutting implement comprising a metal substrate and a coating. The coating comprises zirconium PVD (ZrCrTiNO) alone or in conjunction with titanium nitride (TiN). The coating is preferably clear (i.e., transparent).

According to one aspect, the coating is ZrCRTiNO composed of 40-90 zirconium (Zr), 3-30 chromium (Cr), and 1-10 titanium (Ti).

According to another aspect, the coating is ZrCRTiNO composed of 30-80 zirconium (Zr), 5-50 chromium (Cr), and 5-50 titanium (Ti).

According to yet another aspect, the coating has a first layer and a second layer. The first layer is titanium nitride (TiN) and the second layer is ZrCRTiNO composed of 30-80 zirconium (Zr), 5-50 chromium (Cr), and 5-50 titanium (Ti).

According to some aspects, the metal substrate is any polished metal, such as stainless steel having a grade of 4116 or 420J2.

These and other aspects of the invention will be apparent from and elucidated with reference to the embodiment(s) described hereinafter.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWING(S)

The present invention will be more fully understood and appreciated by reading the following Detailed Description in conjunction with the accompanying drawings. The accompanying drawings illustrate only typical embodiments of the disclosed subject matter and are therefore not to be considered limiting of its scope, for the disclosed subject matter may admit to other equally effective embodiments. Reference is now made briefly to the accompanying drawings, in which:

FIG. 6I is a side view of an exemplary embodiment of a freshwater fillet knife;

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known structures are omitted so as not to unnecessarily obscure the invention in detail. It should be understood, however, that the detailed description and the specific non-limiting examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Figure 1:
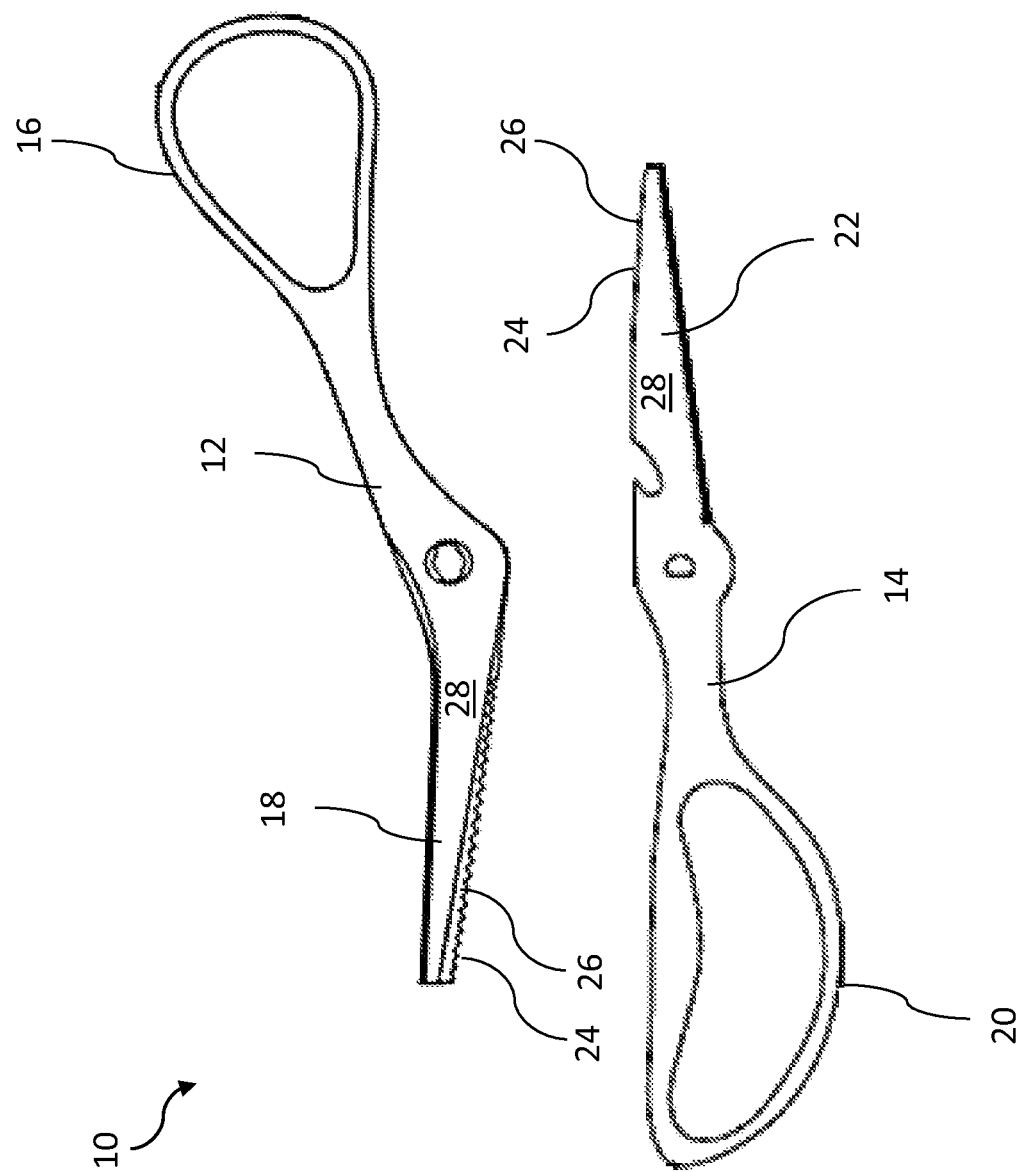
FIG. 1 is side views of an exemplary embodiment of a pair of shears.

Referring now to the figures, wherein like reference numerals refer to like parts throughout, FIG. 1 shows a cutting implement in the form of a pair of shears (e.g., marine shears) generally indicated by reference numeral 10 is illustrated.

Shears 10 have a first half 12 pivotally connected to a second half 14 (note, the shears 10 in FIG. 1 show the first and second halves 12, 14 separated for clarity). First and second halves 12, 14 are pivotally connected by conventional connection means, such as a screw and a post (not shown). First half 12 can have a first handle 16 and a first blade 18. Similarly, second half 14 can have a second handle 20 and a second blade 22, In FIG. 1, each half 12, 14 has a unitary handle and blade portion. Each blade 18, 22 has a cutting edge 24. Preferably, cutting edge 24 is formed by way of a bevel 26 disposed on each blade 18, 22, respectively. Thus, shears 10 provide a pair of complementary cutting blades 18, 22 for fishing and outdoor products.

In the embodiment of shears 10 shown in FIG. 1, shears 10 is moved to an open position by moving first handle 16 and second handle 20 away from each other, separating first blade 18 and second blade 20. An object (not shown) is placed between first blade 18 and second blade 20 and then, first and second handles 16, 20 are moved back toward each other. The culling action is performed by cutting edges 24 on first blade 18 and second blade 22.

Blades 18, 22 are preferably made of steel, more preferably stainless steel, such as stainless steel 420. In addition, blades 18, 22 can be heat-treated to further increase the hardness of the blades. Shears 10 further include a coating 28 disposed on each blade 18, 22. Coating 28 provides cutting edges 24 with extremely tough, hard, wear resistant characteristics. The increased hardness of cutting edges 24 provides shears 10 with substantially increased longevity, while also providing the scissors with corrosion resistance, as well as providing a smooth and uniform appearance and color.

In some embodiments, coating 28 provides shears 10 with an aesthetically acceptable color or appearance and in some instances, coating 28 differentiates blades 18, 22 having coating 28 from uncoated blades. Coating 28 also increases the ease of use of shears 10 by providing blades 18, 22 with a smooth surface finish, which reduces friction between blades 18, 22 during use. Thus, blades 18, 22 have less friction between the two inside blade faces, which provides a smoother cutting action and less cutting effort than in coated blades without coating 28.

Coating 28 is zirconium PVD (ZrCrTiNO), titanium nitride (TiN), or a combination of the two. Coating 28 is used to coat a polished substrate and, more particularly, a polished metal substrate (e.g., stainless steel grade 4116 or 420J2). In FIG. 1, coating 28 is disposed on blades 18, 22 such that the coating forms a metallurgical bond with the blades, which resists flaking, blistering, chipping, and peeling. In fact, coating 28 is adsorbed into the surface layer of the metal of blades 18, 22. Coating 28 is disposed on blades 18, 22 with a thickness in a range between about 0.2 and 0.5 microns, more preferably about 0.4 microns.

In a first embodiment, coating 28 is a clear (i.e., transparent), protective coating having the formula ZrCrTiNO, where Zr=40-90%, Cr=3-30% and Ti=1-10%. The zirconium PVD (ZrCrTiNO) coating 28 can be disposed on blades 18, 22 according to methods such as plasma enriched physical vapor deposition processes. The thickness of the zirconium PVD (ZrCrTiNO) coating 28 is within the range of 0.2 and 0.5 microns, as stated above. For steel blades 22, 26 (or any other steel cutting implement (4116 or 420J2)), the zirconium PVD (ZrCrTiNO) coating 28 provides protection from corrosion for a minimum of 200 hours. The 200-hour minimum has been determined through exposure of the zirconium PVD (ZrCrTiNO) coating 28 on blades 18, 22 (or any other steel cutting implement (4116 or 420J2)) to an ASTMB117 Salt fog test.

In a second embodiment, coating 28 is titanium nitride (TiN). Titanium nitride (TiN) coated steel is described in U.S. Pat. No. 6,988,318, assigned to the assignee hereof, and the contents of which are incorporated herein by reference. When coating 28 is composed of titanium chromium nitride (TiCrN) and disposed on the blades 18, 22 (or any other steel cutting implement (4116 or 420J2)), coating 28 creates a satin silver appearance. In some instances, the titanium chromium nitride (TiCrN) coating 28 has a thickness in the range of 0.3 microns and 0.5 microns and a hardness in a range of about 5.7 to about 9.1 gigapascals. One of the main benefits of titanium nitride (TiN) coated steel is that it is 3 to 5 times harder than uncoated steel.

In a third embodiment, coating 28 is a clear (i.e., transparent), protective coating having the formula ZrCrTiNO, where Zr=30-80%, Cr=5-50% and Ti=5-50%. The zirconium PVD (ZrCrTiNO) coating 28 can be disposed on blades 18, 22 according to methods such as plasma enriched physical vapor deposition processes. The thickness of the zirconium PVD (ZrCrTiNO) coating 28 is within the range of 0.2 and 0.5 microns, as stated above. For steel blades 18, 22 (or any other steel cutting implement (1116 or 420J2)), the zirconium PVD (ZrCrTiNO) coating 28 provides protection from corrosion for a minimum of 200 hours. The 200-hour minimum has been determined through exposure of the zirconium PVD (ZrCrTiNO) coating 28 on blades 18, 22 (or any other steel cutting implement (4116 or 420J2)) to an ASTMB117 Salt fog test.

In a fourth embodiment, coating 28 is a combination of titanium nitride (TiN) and zirconium PVD (ZrCrTiNO) of either the first or third embodiment above. First, titanium nitride (TiN) is disposed on a polished metal substrate, such as blades 18, 22 (or any other steel cutting implement (4116 or 420J2). Then, zirconium PVD (ZrCrTiNO) is disposed on the polished metal substrate, such as blades 18, 22 (or any other steel cutting implement (4116 or 420J2) over the titanium nitride (TiN). Thus, coating 28 comprises a first layer of titanium nitride (TiN) and a second layer of zirconium PVD (ZrCrTiNO). The combination of layers in coating 28 provide a hardness of 3 to 5 times that of uncoated steel and corrosion resistance of at least 200 hours.

It should also be recognized that coating 28 has been described above by way of example only as finding use with a cutting implement in the form of shears 10. Of course, coating 28 can provide the aforementioned benefits to other cutting implements or polished metal substrates. Such cutting implements can include other scissors, knives (e.g., fishing and everyday carry), saws, pliers, snips, wire cutter, machetes, axes, hatchets, etc. Further, such cutting implements can include the aforementioned and any others used in fishing and outdoor products. FIGS. 2 to 10 illustrate alternate exemplary embodiments of cutting implements, which have coating 28.

Figure 2:
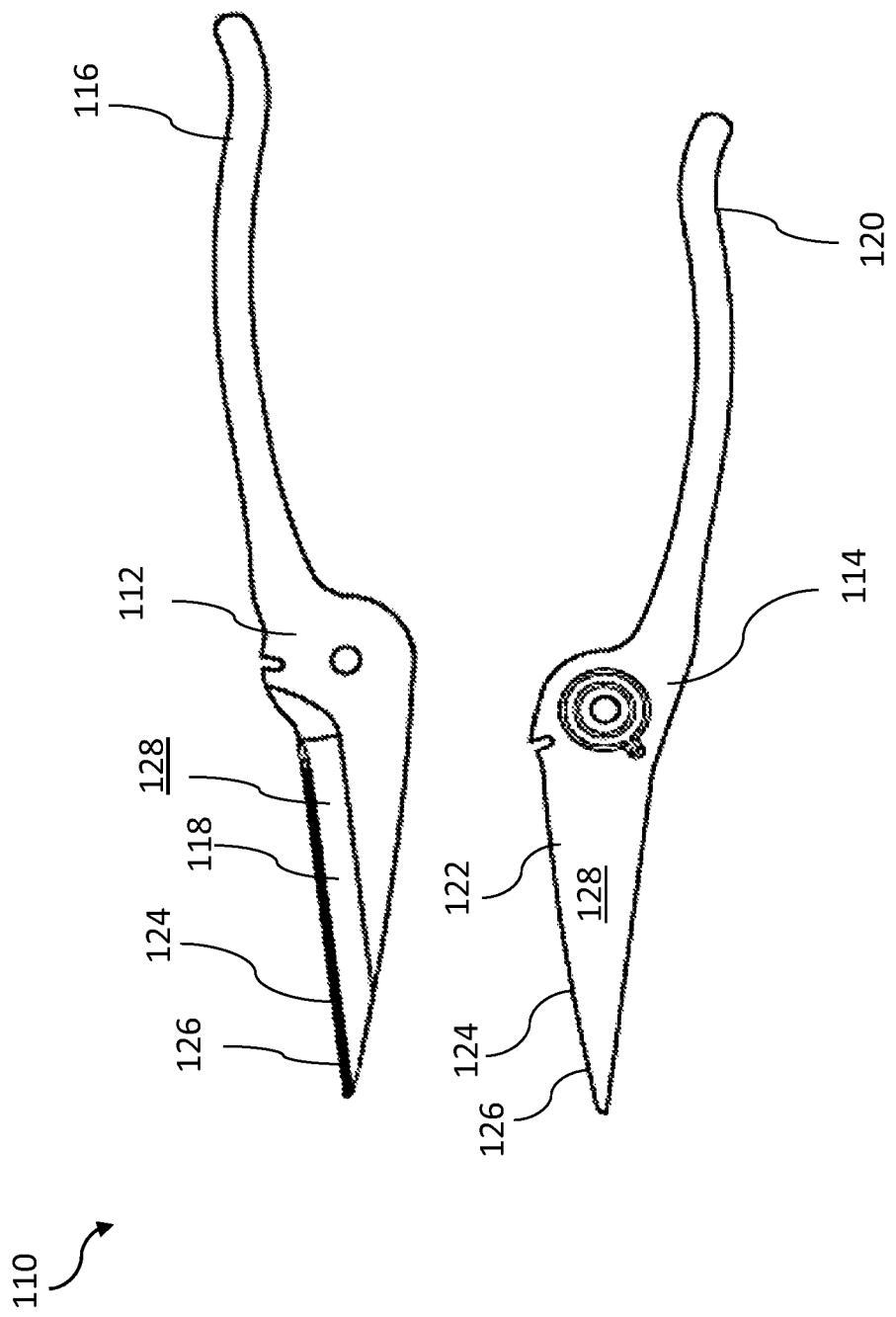
FIG. 2 is side views of an exemplary embodiment of snips.
Figure 3:
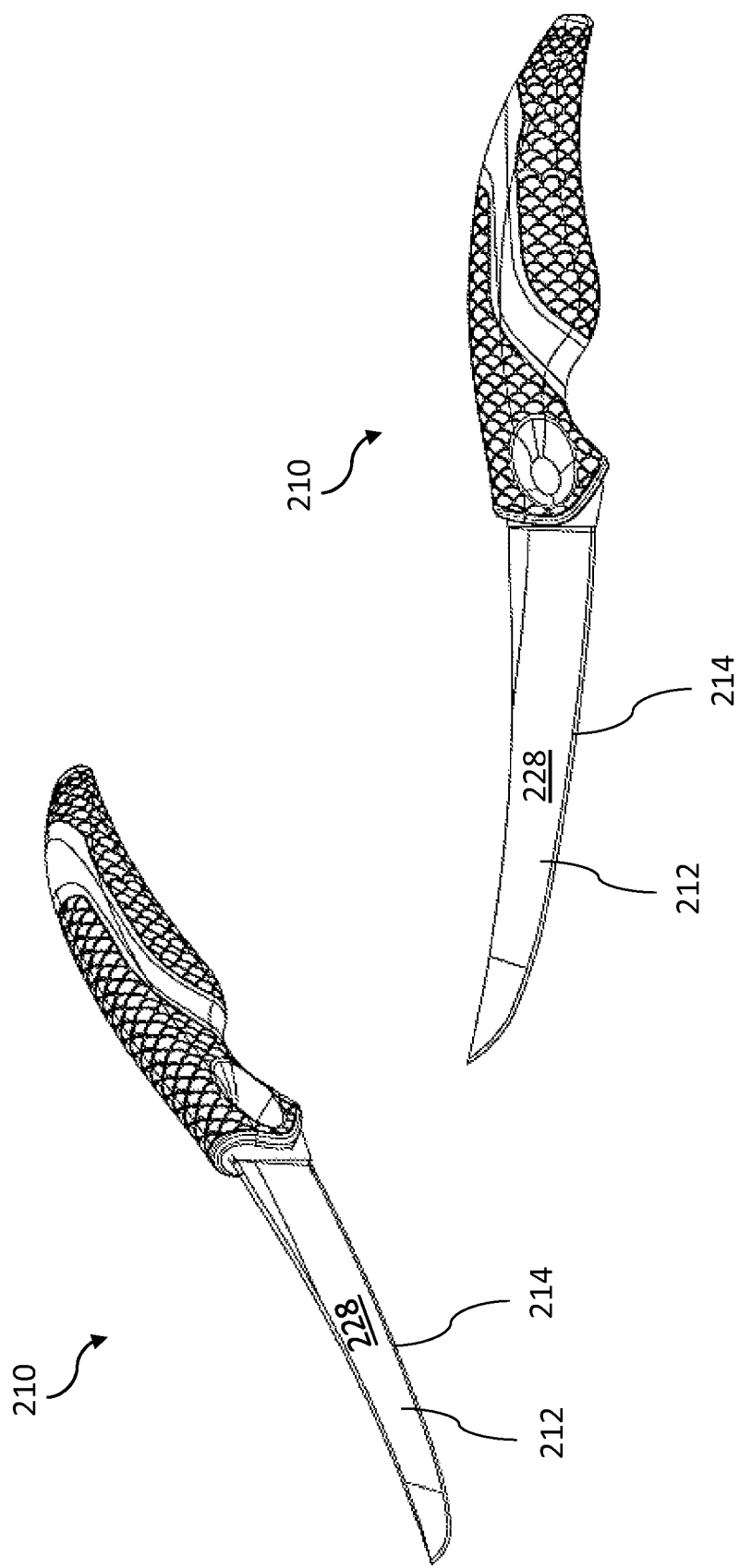
FIG. 3 is perspective and side views of an exemplary embodiment of a boning curved knife.
Figure 4:
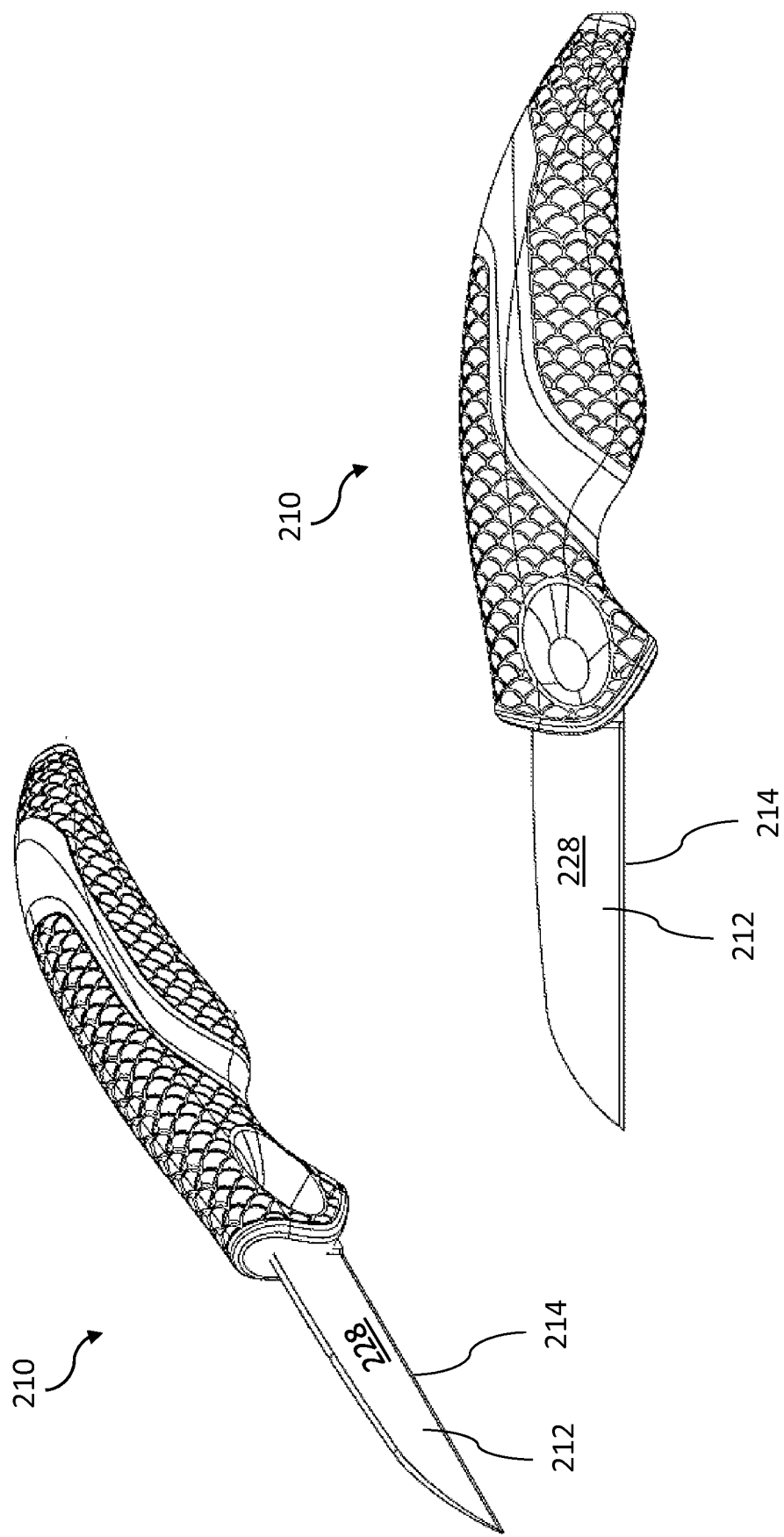
FIG. 4 is perspective and side views of an exemplary embodiment of a bait straight knife.
Figure 5:
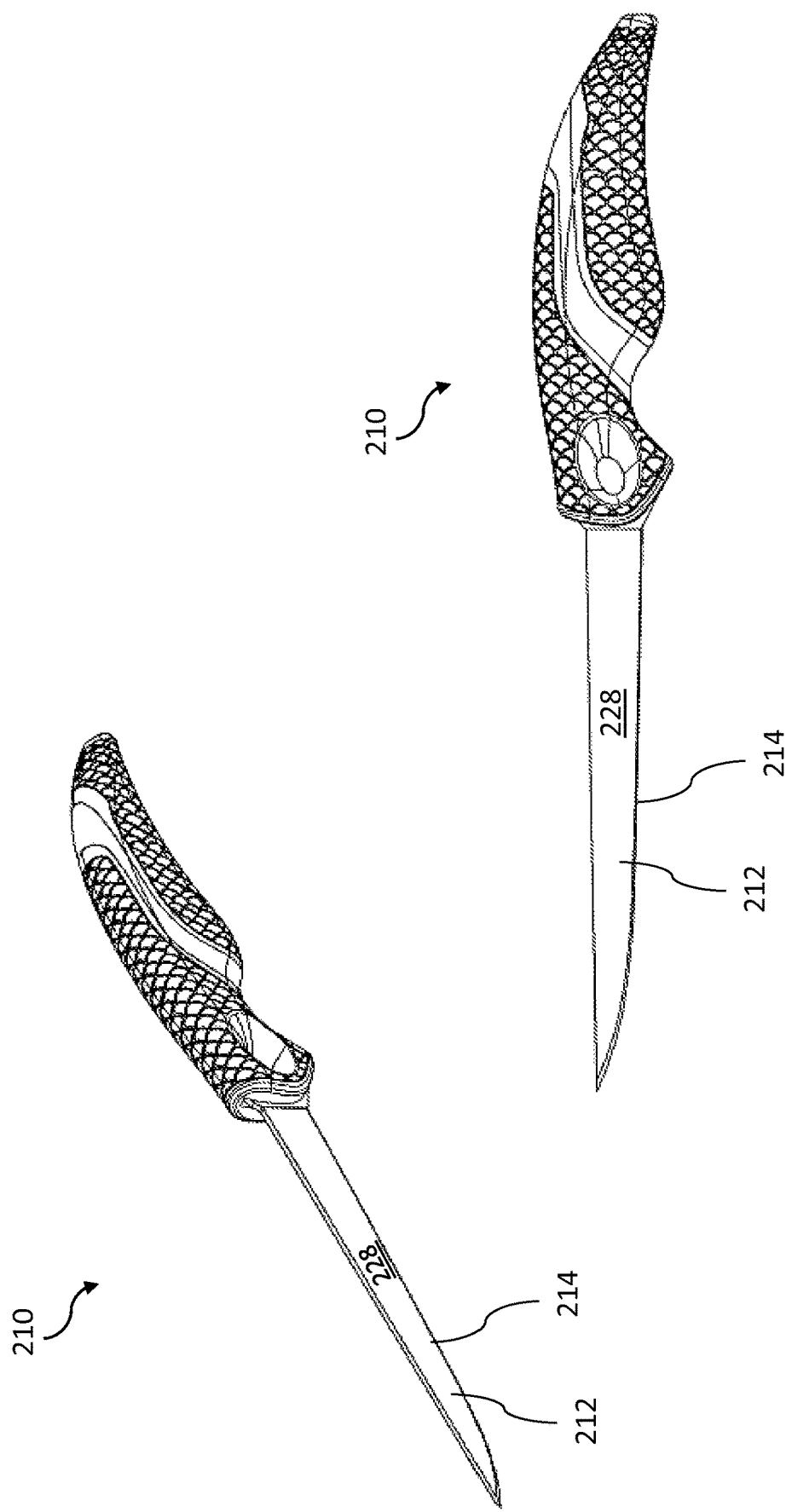
FIG. 5 is perspective and side views of an exemplary embodiment of a filet flex knife.
Figure 61:
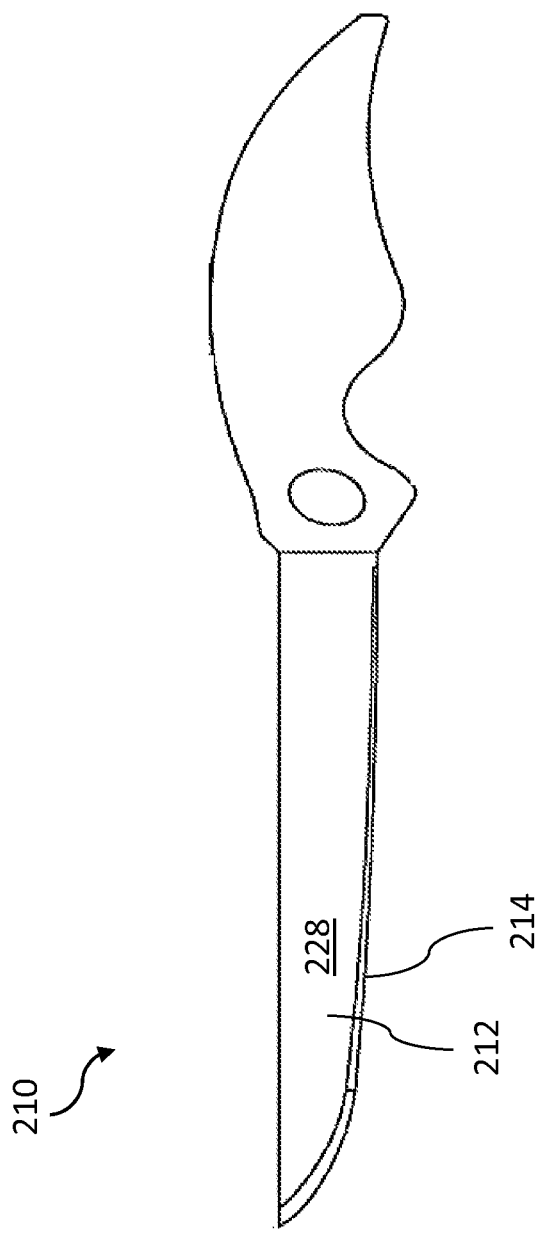

An exemplary embodiment of a culling implement in the form of snips 110 is illustrated in FIG. 2. In the embodiment of snips 110 shown in FIG. 2, snips 110 has first and second halves 112, 114 pivotally connected by conventional connection means, such as a screw and a post (not shown). First half 12 has a first handle 116 and a first blade 118, while second half 14 has a second handle 120 and a second blade 122. In FIG. 2, each half 112, 114 has a unitary handle and blade portion. Each blade 118, 122 has a cutting edge 124. Preferably, cutting edge 124 is formed by way of a bevel 126 disposed on each blade 118, 122, respectively. Thus, snips 110 provide a pair of complementary cutting blades 118, 122 for fishing and outdoor products.

In the embodiment of snips 110 shown in FIG. 2, snips 110 is moved to an open position by moving first handle 116 and second handle 120 away from each other, separating first blade 118 and second blade 122. An object (not shown) is placed between first blade 118 and second blade 122 and then, first and second handles 116, 120 are moved back toward each other. The cutting action is performed by cutting edges 124 on first blade 118 and second blade 122.

First and second blades 118, 120 are preferably made of steel, more preferably stainless steel, such as stainless steel 420. In addition, first and second blades 118, 120 can be heat-treated to further increase the hardness. Snips 110 has a coaling 128 disposed on first and second blades 118, 120. Again, coating 128 has a thickness in a range between about 0.2 microns and 0.5 microns, more preferably about 0.4 microns. Coating 128, like coating 28, provides first and second blades 118, 120 with extremely tough, hard, wear resistant characteristics. This increased hardness provides snips 110 with substantially increased longevity, while also providing the trimmer with corrosion resistance, as well as providing a smooth and uniform appearance and color. Coating 128 can be composed of the formulas of any of the embodiments described above with reference to coating 28.

Figure 6A:
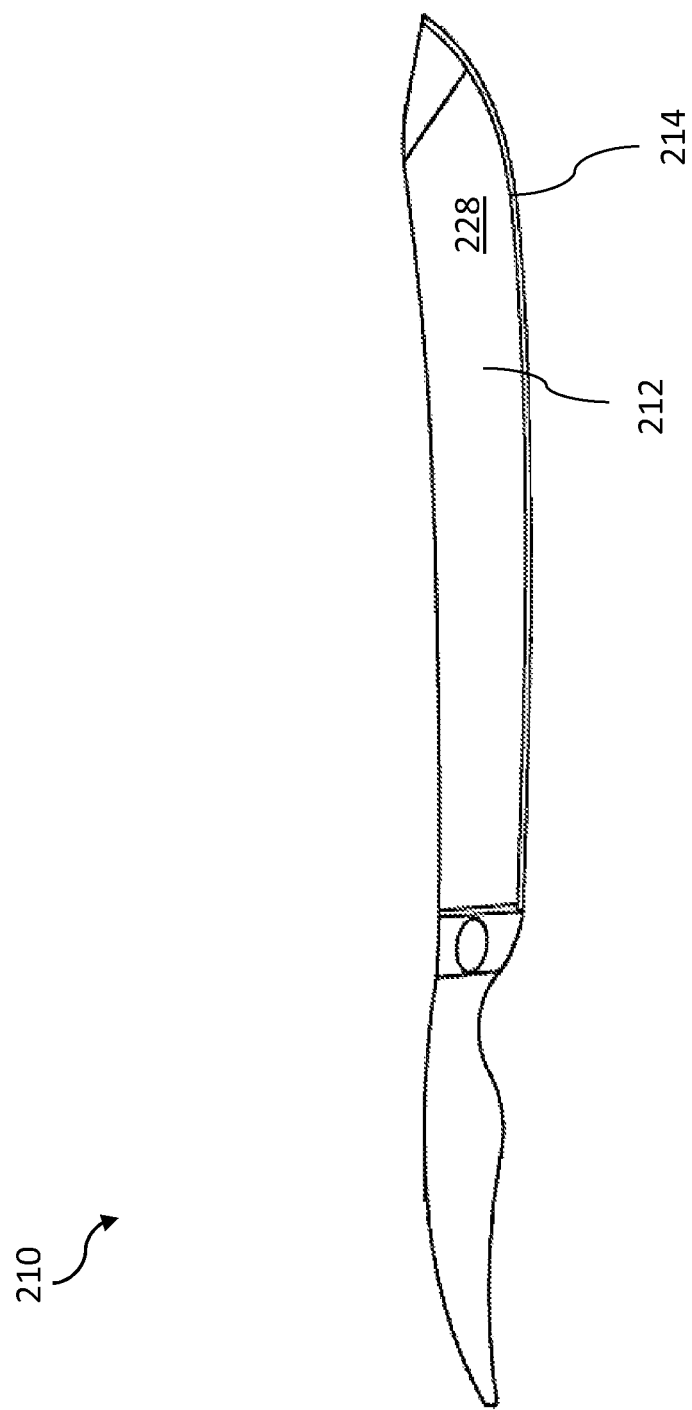
FIG. 6A is a side view of an exemplary embodiment of a butcher knife.
Figure 6B:
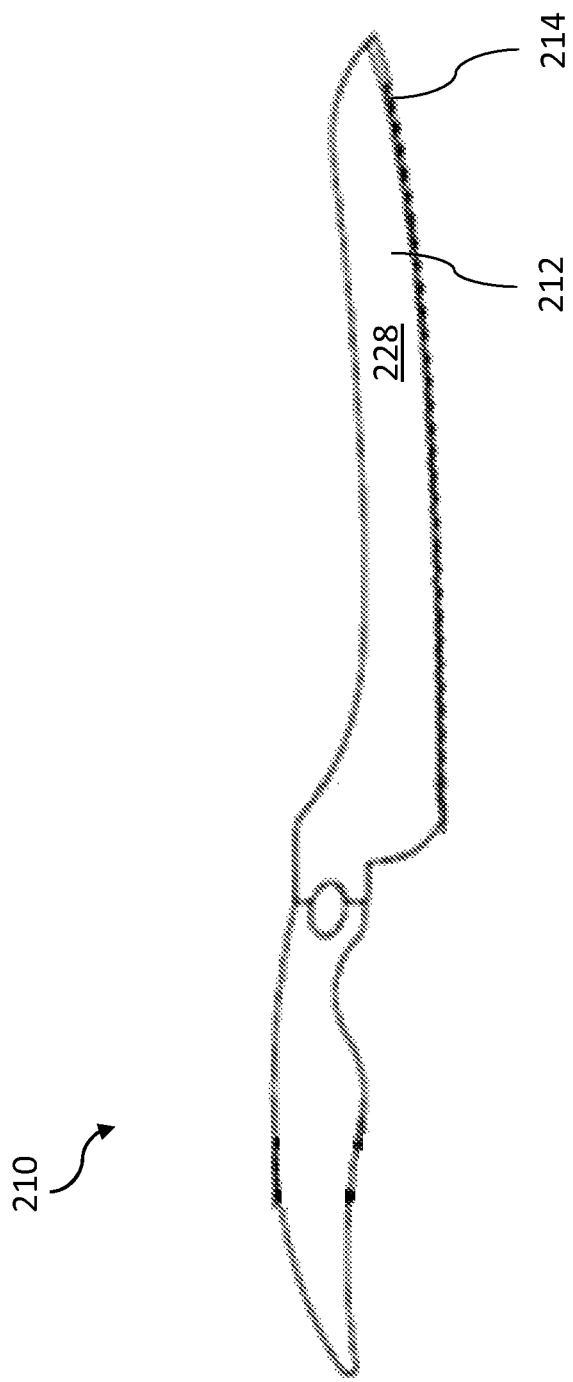
FIG. 6B is a side view of an exemplary embodiment of an offset serrated knife.
Figure 6C:
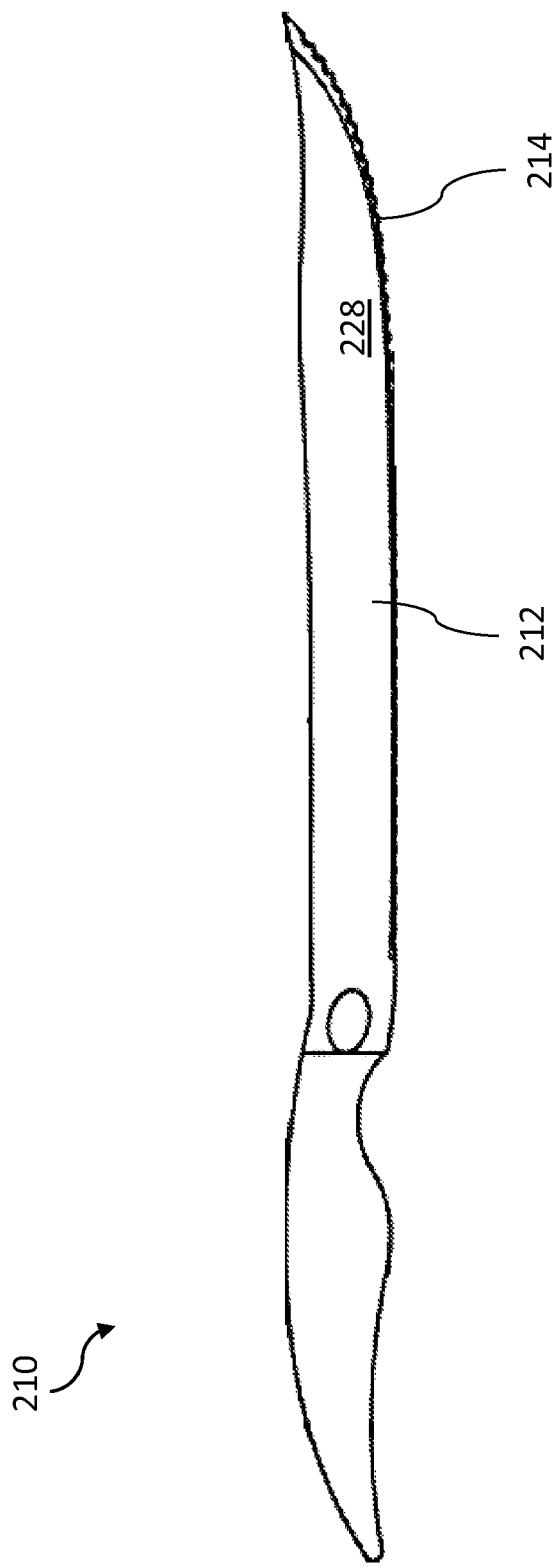
FIG. 6C is a side view of an exemplary embodiment of a serrated knife.
Figure 6D:
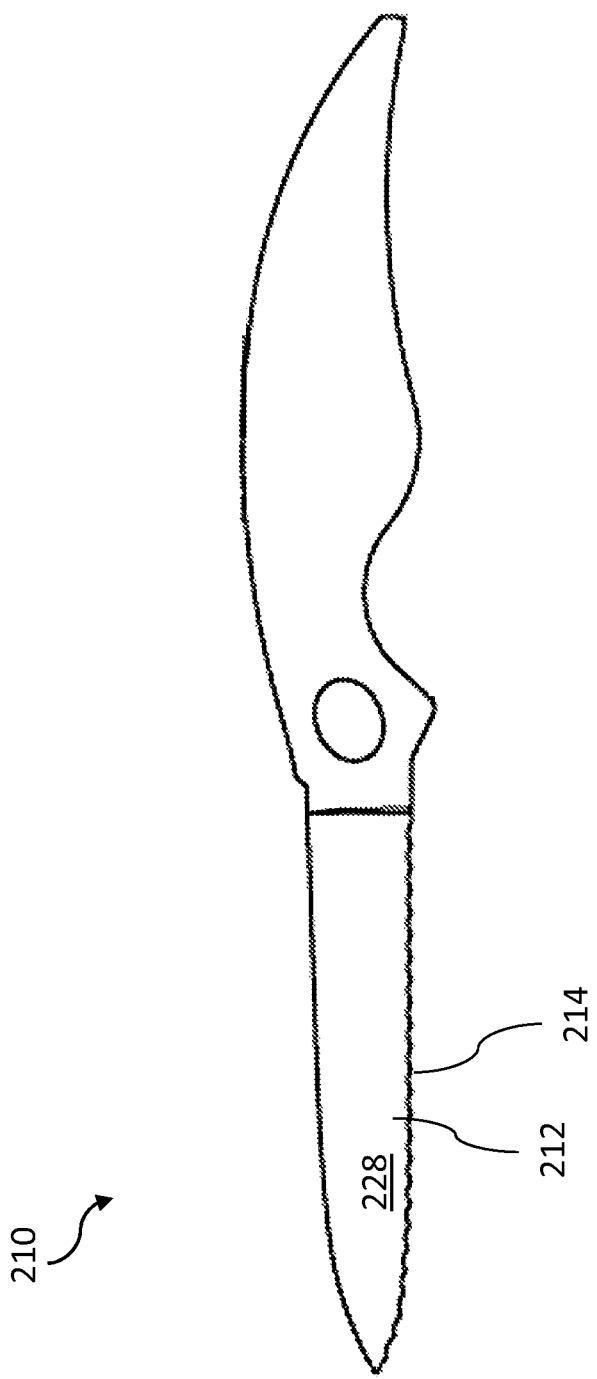
FIG. 6D is a side view of an exemplary embodiment of a net knife.
Figure 6E:
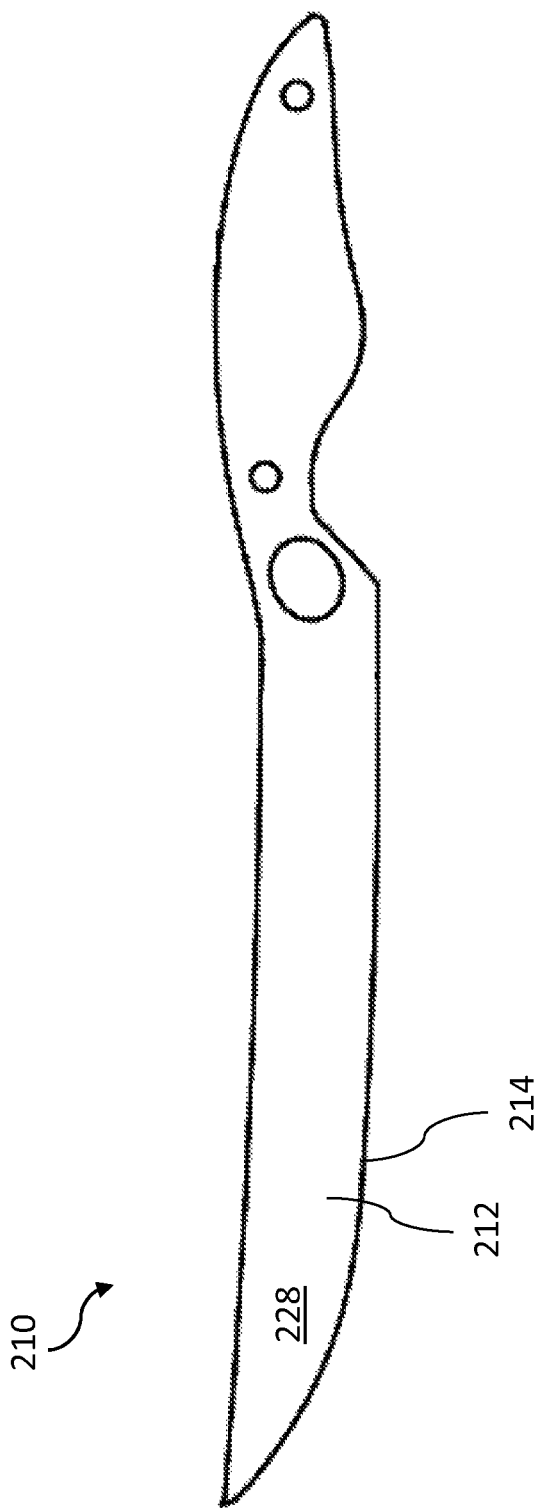
FIG. 6E is a side view of an exemplary embodiment of a wide filet knife.
Figure 6F:
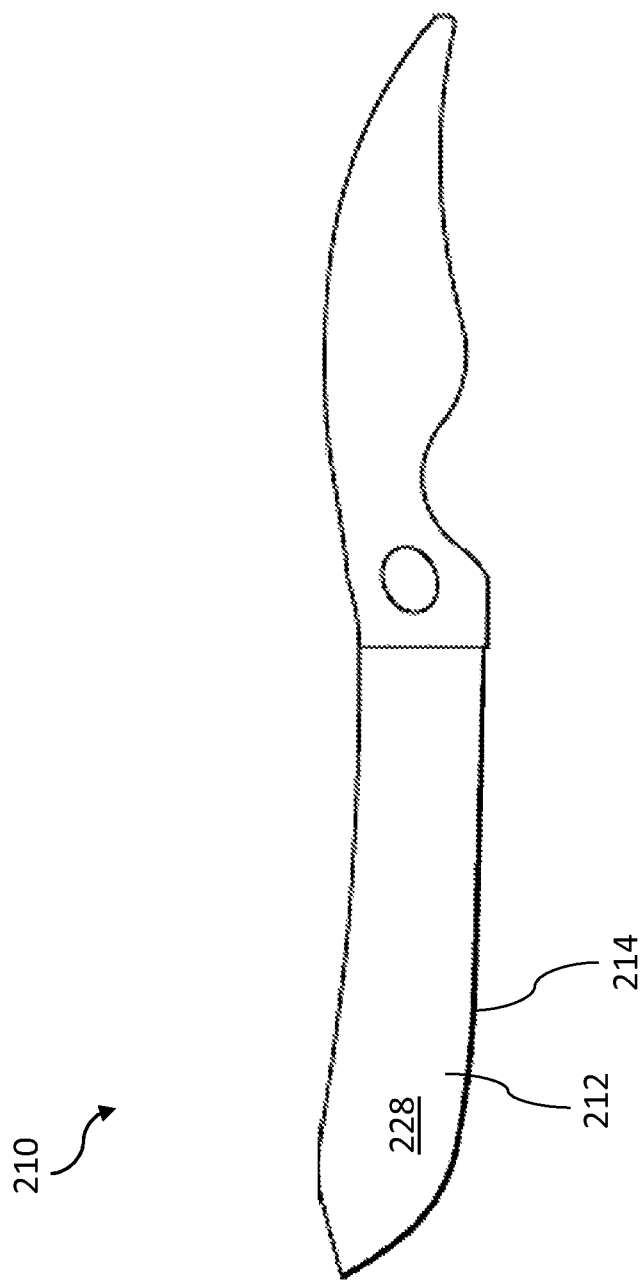
FIG. 6F is a side view of an exemplary embodiment of a butcher knife.
Figure 6G:
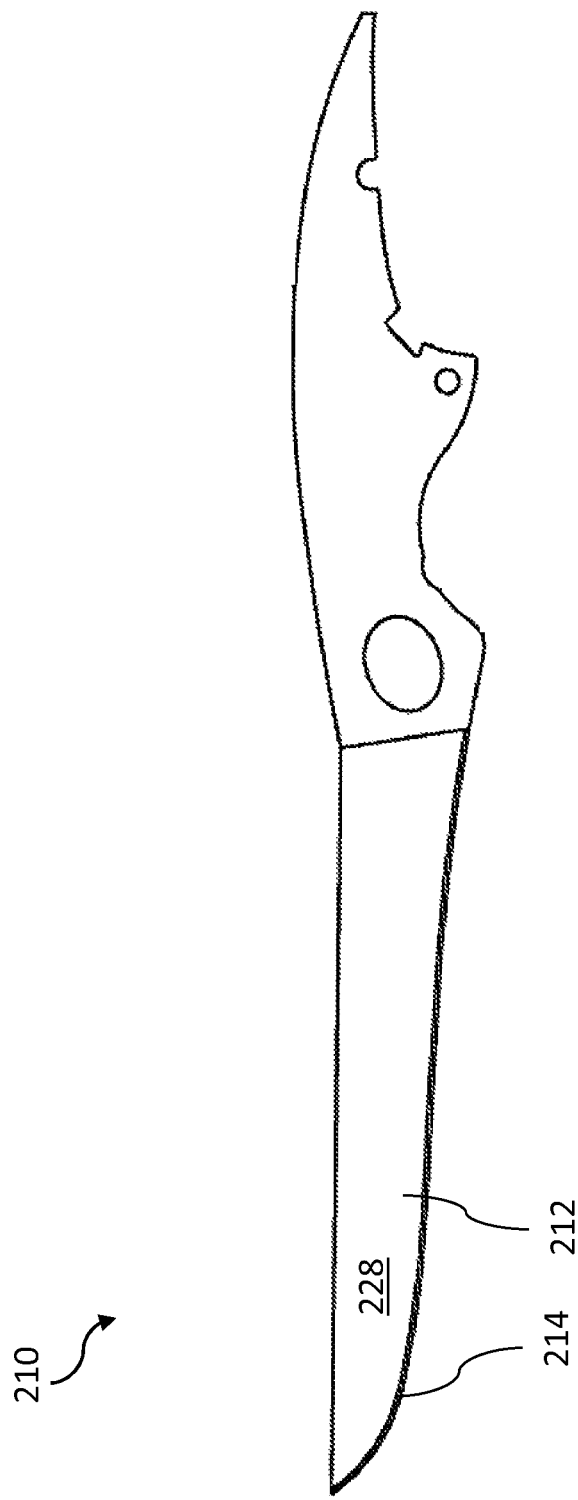
FIG. 6G is a side view of an exemplary embodiment of a filet knife gutting spoon.
Figure 6H:
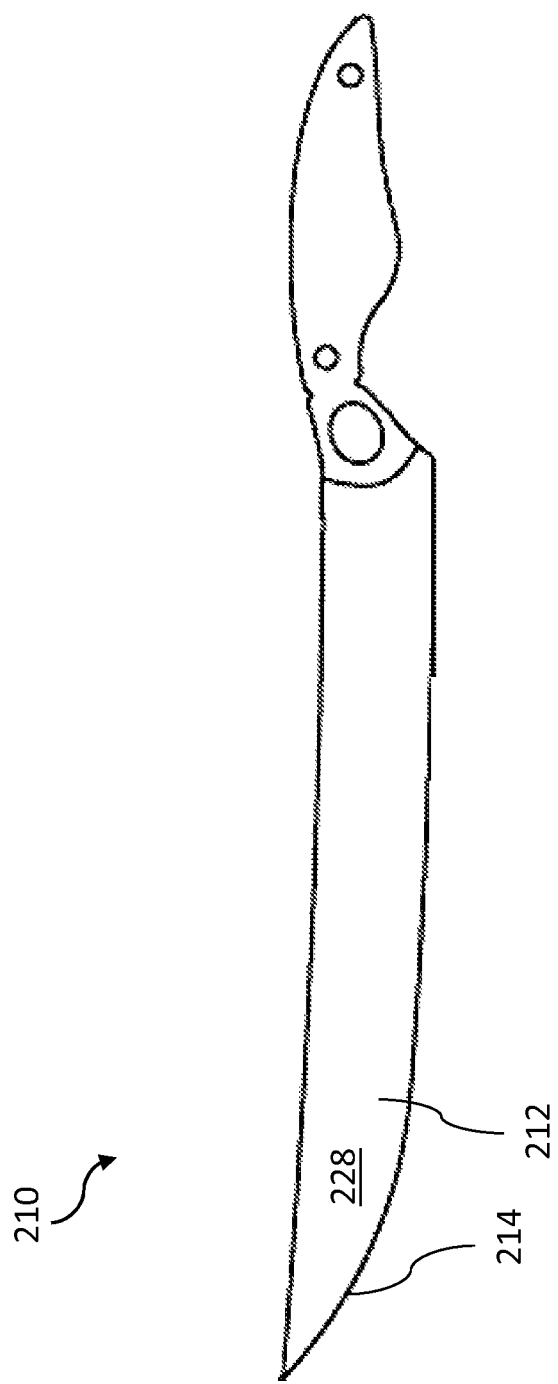
FIG. 6H is a side view of an exemplary embodiment of a wide filet knife.
Figure 6J:
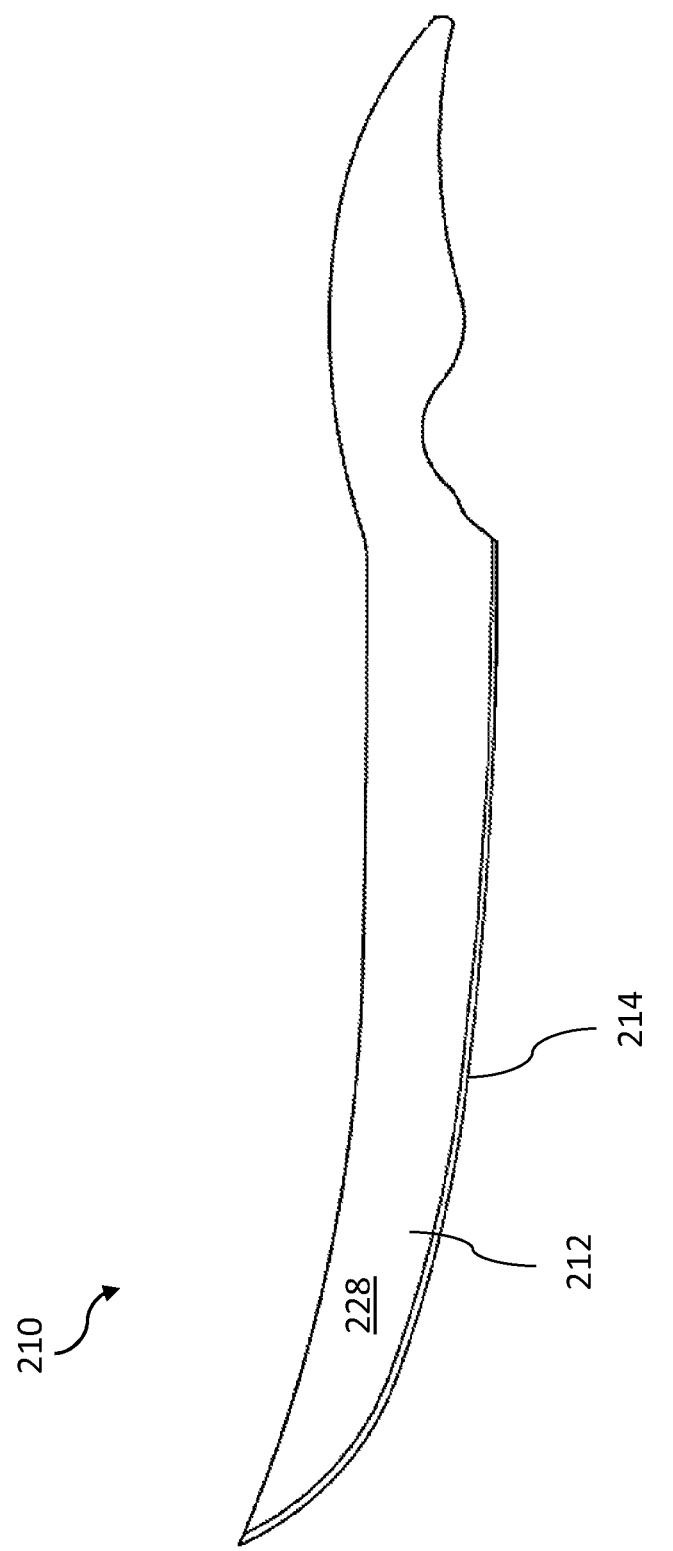
FIG. 6J is a side view of an exemplary embodiment of a curved blade knife.

An exemplary embodiment of a cutting implement in the form of a knife 210 is illustrated in FIGS. 3-6J. Knife 210 is a boning curved knife in FIG. 3, a bait straight knife in FIG. 4, and a filet flex knife in FIG. 5. However, the cutting implement can be any type of knife, such as a butcher knife (FIGS. 6A and 6F), an offset serrated knife (FIG. 6B), a serrated knife (FIG. 6C), a net knife (FIG. ED), a wide filet knife (FIGS. 6E and 6H), a filet knife gutting spoon (FIG. 6G), a freshwater fillet knife, (FIG. 6I), and a curved blade knife (FIG. 6J).

Knife 210 includes a blade 212 with a sharpened peripheral edge 214. In an embodiment, blade 212 is composed of a rugged steel member, preferably stainless steel, such as stainless steel 420. In addition, blade 212 can be heat-treated to further increase the hardness.

In all of the embodiments of knife 210 in FIGS. 3-6J, knife 210 has a coating 228 disposed on blade 212. Coating 228 can be composed of the formulas of any of the embodiments described above with reference to coating 28. As described in detail above with respect to the exemplary embodiment of FIG. 1, coating 228 has a thickness in a range between about 0.2 microns and 0.5 microns, more preferably about 0.4 microns. Coating 228 provides blade 212 with extremely tough, hard, wear resistant characteristics. This increased hardness provides knife 210 with substantially increased longevity, while also providing the trimmer with corrosion resistance, as well as providing a smooth and uniform appearance and color.

Figure 7:
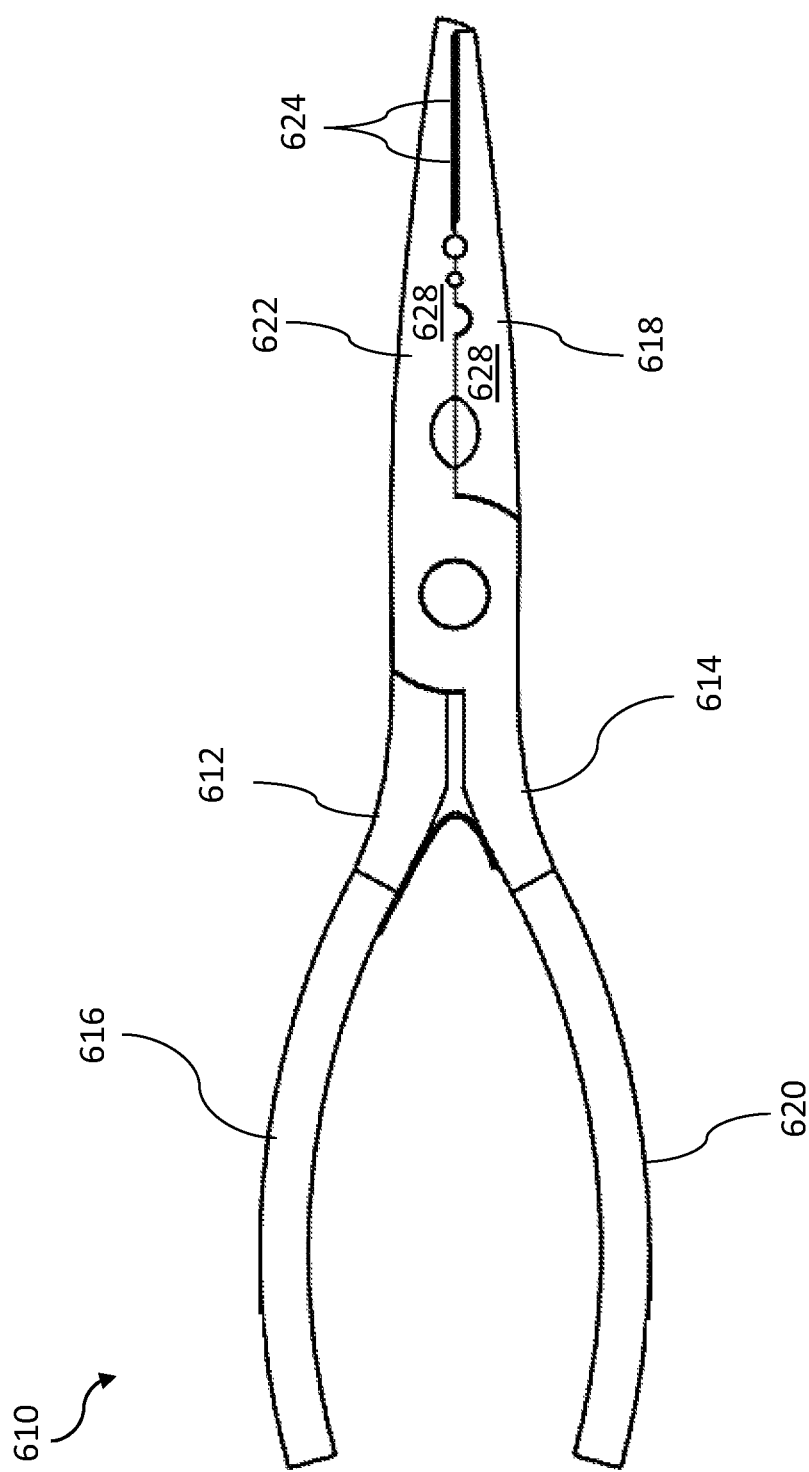
FIG. 7 is a side view of an exemplary embodiment of a pair of pliers.
Figure 8:
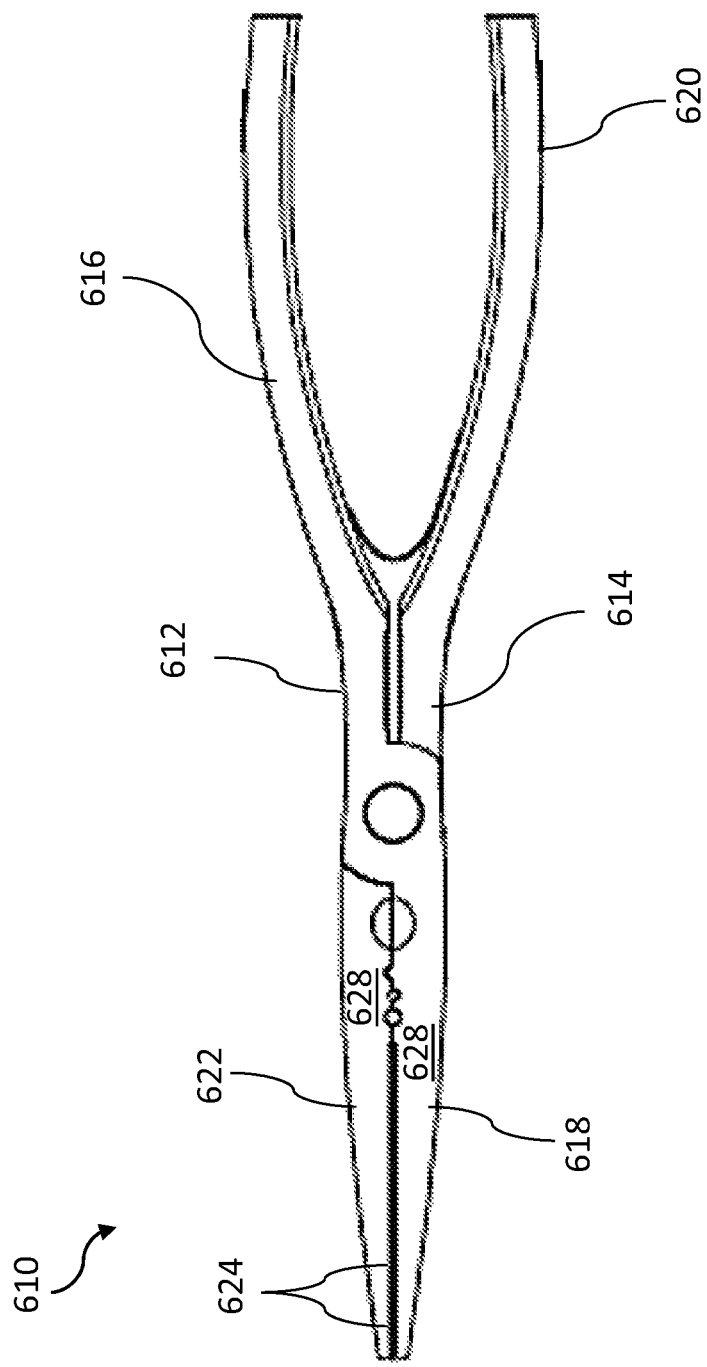
FIG. 8 is a side view of an exemplary embodiment of a pair of long needle nose pliers.
Figure 9:
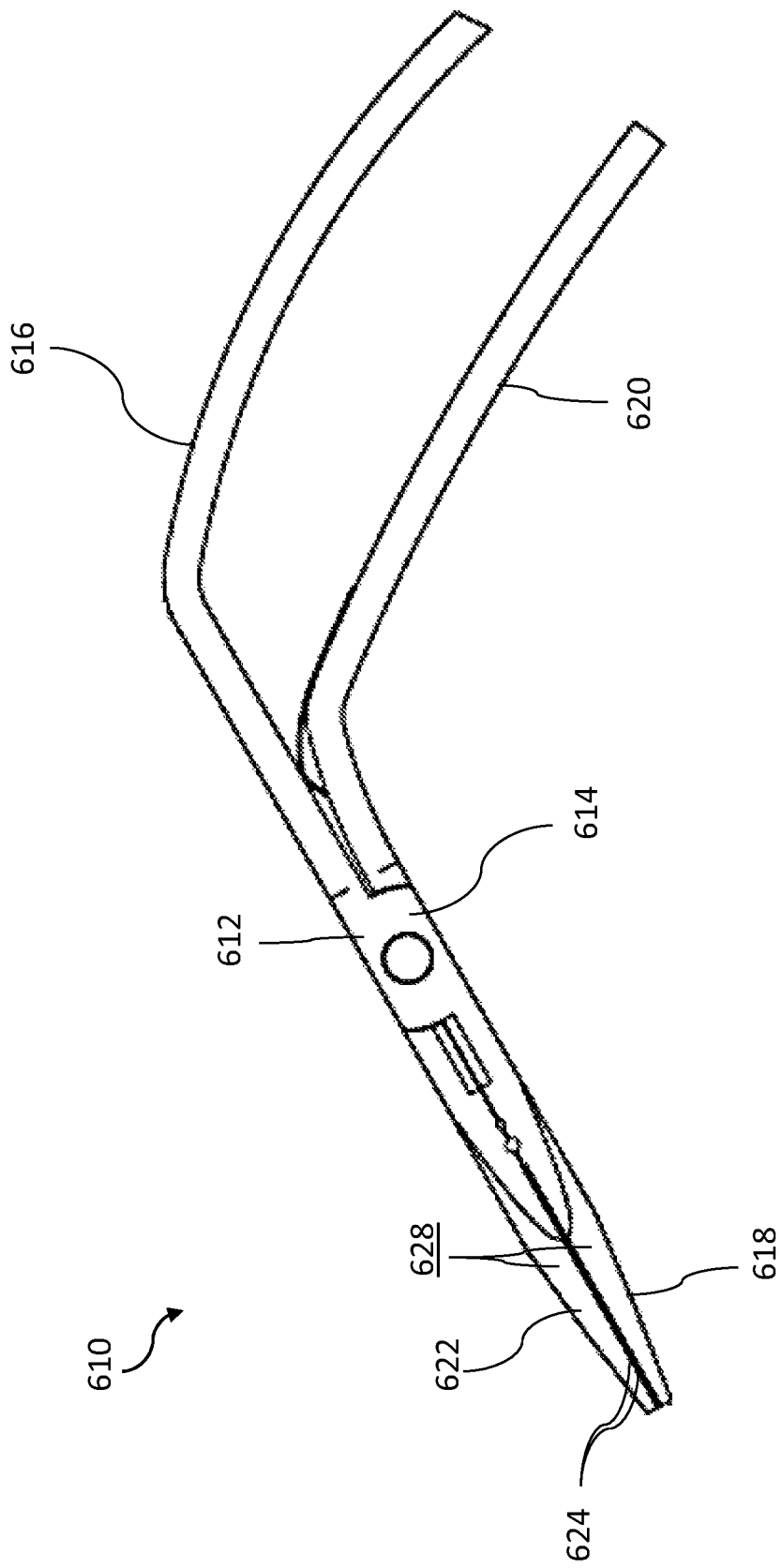
FIG. 9 is a side view of an exemplary embodiment of a pair of split ring pliers.

An exemplary embodiment of a cutting implement in the form of a pair of pliers 610 (e.g., SS pliers, SS long needle nose pliers, or SS split ring pliers) is illustrated in FIGS. 7-9. Pliers 610 include a first half 612 pivotally connected to a second half 614 by conventional connection means, such as a screw and a post (not shown). First half 612 can have a first handle 616 and a first blade 618 (or first gripping jaw). Similarly, second half 614 can have a second handle 620 and a second blade 622 (or second gripping jaw). In the embodiments shown in FIGS. 7-9, each half 612, 614 has a unitary handle and blade portion. Each blade/gripping jaw 618, 622 has a cutting edge (or gripping edge) 624. Thus, pliers 610 provide a pair of complementary cutting blades/gripping jaws 618, 622 for fishing and outdoor products.

In the embodiment of pliers 610 shown in FIGS. 7-9, pliers 610 are moved to an open position by moving first handle 616 and second handle 620 away from each other, separating first blade 618 and second blade 620, An object (not shown) is placed between first blade 618 and second blade 620 and then, first and second handles 616, 620 are moved back toward each other. The cutting or gripping action is performed by cutting edges 624 on first blade 618 and second blade 622.

Each cutting blade/gripping jaw 618, 622 is composed of a rugged steel member, preferably stainless steel, such as stainless steel 420. In addition, cutting blades/gripping jaws 618, 622 can be heat-treated to further increase the hardness. Pliers 610 has a coating 628 disposed on cutting blades/gripping jaws 618, 622. Coating 628 can be composed of the formulas of any of the embodiments described above with reference to coating 28. As described in detail above with respect to the exemplary embodiments of FIG. 1, coating 628 has a thickness in a range between about 0.2 microns and 0.5 microns, more preferably about 0.4 microns. Coating 628 provides cutting blades/gripping jaws 618, 622 with extremely tough, hard, wear resistant characteristics. This increased hardness provides pliers 610 with substantially increased longevity, while also providing the trimmer with corrosion resistance, as well as providing a smooth and uniform appearance and color.

Figure 10:
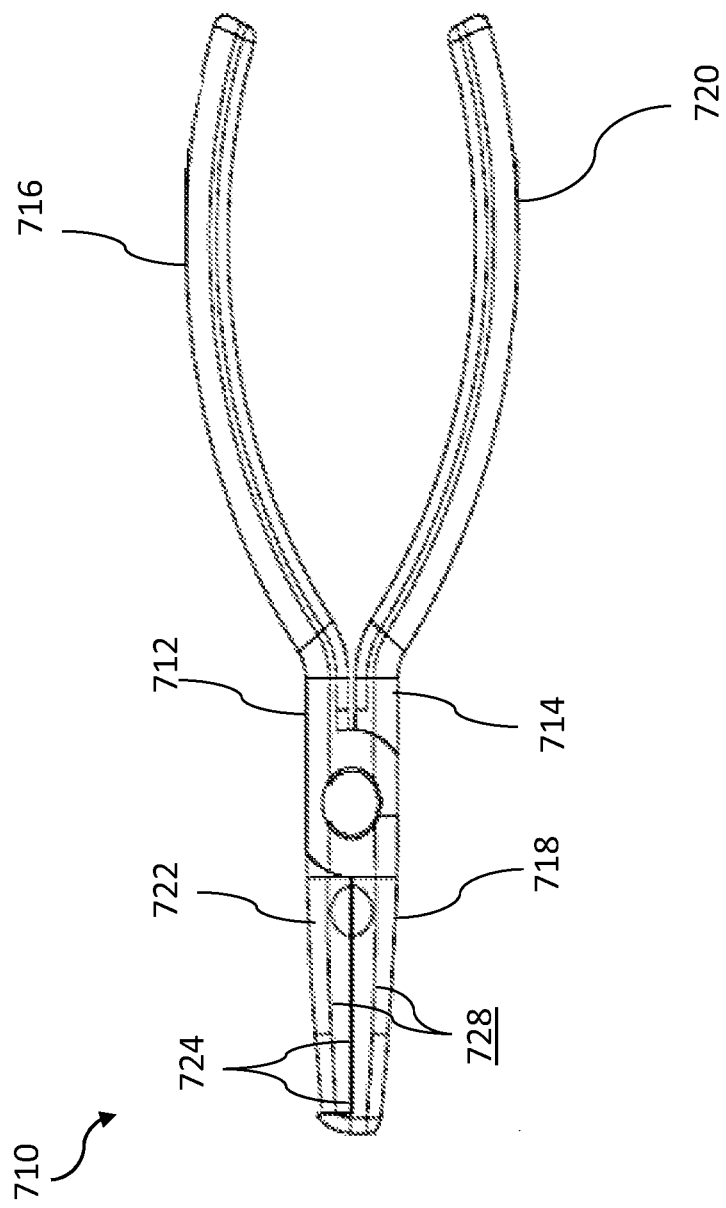
FIG. 10 is a side view of an exemplary embodiment of a pair of splitters.

An exemplary embodiment of a cutting implement in the form of a pair of splitters 710 is illustrated in FIG. 10. Splitters include a first half 712 pivotally connected to a second half 714 by conventional connection means, such as a screw and a post (not shown). First half 712 can have a first handle 716 and a first blade 718 (or first gripping jaw). Similarly, second half 714 can have a second handle 720 and a second blade 722 (or second gripping jaw). In the embodiment shown in FIG. 10, each half 712, 714 has a unitary handle and blade portion. Each blade/gripping jaw 718, 722 has a cutting edge (or gripping edge) 724. Thus, splitters 710 provide a pair of complementary cutting blades/gripping jaws 718, 722 for fishing and outdoor products.

In the embodiment of splitters 710 shown in FIG. 10, splitters 710 are moved to an open position by moving first handle 716 and second handle 720 away from each other, separating first blade 718 and second blade 720, An object (not shown) is placed between first blade 718 and second blade 720 and then, first and second handles 716, 720 are moved back toward each other. The cutting or gripping action is performed by cutting edges 724 on first blade 718 and second blade 722.

Each cutting blade/gripping jaw 718, 722 is composed of a rugged steel member, preferably stainless steel, such as stainless steel 420. In addition, cutting blades/gripping jaws 718, 722 can be heat-treated to further increase the hardness. Still referring to FIG. 10, splitters 710 has a coating 728 disposed on cutting blades/gripping jaws 718, 722. Coating 728 can be composed of the formulas of any of the embodiments described above with reference to coating 28. As described in detail above with respect to the exemplary embodiments of FIG. 1, coating 728 has a thickness in a range between about 0.2 microns and 0.5 microns, more preferably about 0.4 microns. Coating 728 provides cutting blades/gripping jaws 718, 722 with extremely tough, hard, wear resistant characteristics. This increased hardness provides splitters 710 with substantially increased longevity, while also providing the trimmer with corrosion resistance, as well as providing a smooth and uniform appearance and color.

The coating described herein for stationery cutting implements provides a cost competitive manner to improve the hardness, longevity, stain resistance, and ease of use of the cutting implement.

It should also be noted that the terms "first", "second", and "third" and the like may be used herein to modify various elements. These modifiers do not imply a spatial, sequential, or hierarchical order to the modified elements unless specifically stated.

While the invention has been described with reference to one or more exemplary embodiments, it will be understood by those skilled in the art that various changes may be made and equivalents may be Substituted for elements thereof without departing from the scope of the invention. In addition, many modifications may be made to adapt a particular situation or material to the teachings of the disclosure without departing from the essential Scope thereof. Therefore, it is intended that the invention not be limited to the particular embodiment(s) disclosed as the best mode contemplated for carrying out this invention, but that the invention will include all embodiments falling within the scope of the appended claims.

What is claimed is:

1. A cutting implement, comprising:
   a polished metal substrate; and
   a coating disposed on the metal substrate, wherein said coating is ZrCRTiNO containing 40-90% zirconium (Zr), 3-30% chromium (Cr), and 1-10% titanium (Ti).

2. The cutting implement of claim 1, wherein the metal substrate is stainless steel.

3. The cutting implement of claim 1, wherein the metal substrate is a pair of complementary cutting blades, the coating disposed on each of said pair of complementary cutting blades.

4. The cutting implement of claim 1, wherein the coating has a thickness within the range of 0.2 and 0.5 microns.

5. The cutting implement of claim 1, wherein the coating is transparent.

6. The cutting implement of claim 1, wherein, the coating is resistant to corrosion for at least 200 hours.

7. A cutting implement, comprising:
   a metal substrate; and
   a coating disposed on the metal substrate, wherein said coating is ZrCRTiNO containing 30-80% zirconium (Zr), 5-50% chromium (Cr), and 5-50% titanium (Ti).

8. The cutting implement of claim 7, wherein the metal substrate is polished.

9. The cutting implement of claim 7, wherein the metal substrate is stainless steel.

10. The cutting implement of claim 7, wherein the metal substrate is a pair of complementary cutting blades, the coating disposed on each of said pair of complementary cutting blades.

11. The cutting implement of claim 7, wherein the coating has a thickness within the range of 0.2 and 0.5 microns.

12. The cutting implement of claim 7, wherein the coating is transparent.

13. The cutting implement of claim 7, wherein, the coating is resistant to corrosion for at least 200 hours.

14. A cutting implement, comprising:
    a metal substrate; and
    a coating disposed on the metal substrate, wherein said coating has a first layer and a second layer;
    wherein the first layer is composed of titanium nitride (TiN); and
    wherein the second layer is composed of ZrCRTiNO containing 30-80% zirconium (Zr), 5-50% chromium (Cr), and 5-50% titanium (Ti).

15. The cutting implement of claim 14, wherein the metal substrate is stainless steel.

16. The cutting implement of claim 14, wherein the metal substrate is a pair of complementary cutting blades, the coating disposed on each of said pair of complementary cutting blades.

17. The cutting implement of claim 14, wherein the coating has a thickness within the range of 0.2 and 0.5 microns.

18. The cutting implement of claim 14, wherein the coating is resistant to corrosion for at least 200 hours.

19. The cutting implement of claim 14, wherein the coating has a hardness 3 to 5 times greater than uncoated steel.

* * * * *